Oct. 5, 1965 J. FUNARI 3,210,182

SELECTIVE REMOVAL OF EXCESS SOLDER

Filed Aug. 13, 1962

2 Sheets-Sheet 1

INVENTOR
JOSEPH FUNARI

BY Donald R. Campbell
ATTORNEY

United States Patent Office 3,210,182

Patented Oct. 5, 1965

3,210,182

SELECTIVE REMOVAL OF EXCESS SOLDER

Joseph Funari, Vestal, N.Y., assignor to International Business Machines Corporation, New York, N.Y., a corporation of New York Filed Aug. 13, 1962, Ser. No. 216,516
4 Claims. (Cl. 75—63)

This invention relates to the removal of excess solder, and more particularly to the selective removal of tin-lead solder projecting in excess beyond a desired plane.

Low melting point quaternary alloys of bismuth, lead, tin and cadmium are known in a variety of compositions having melting temperatures in the range of about 117° F. to above 200° F. These low-melting alloys are also known as fusible alloys and exist in both eutectic and non-eutectic compositions. In accordance with the invention, it has been noted that such fusible quaternary alloys exhibit a high solubility for tin and lead and have the practical application of selectively dissolving tin-lead solder.

An object of the invention is to provide a new and improved method of removing solder which projects beyond a desired distance from the surface of a printed circuit board or the like on which the solder is deposited.

In a more general sense, another object is the provision of an improved method of selectively removing solder which projects farther than is desired from a surface on which the solder is deposited.

Yet another object of the invention is to provide a new and improved method for salvaging components soldered to a chassis or board which is simple and convenient and causes no harm to temperature sensitive components such as transistors.

Still another object is the provision of a new use for lowing melting point bismuth-lead-in-cadium alloys.

The foregoing and other objects, features and advantages of the invention will be apparent from the following more particular description of a preferred embodiment of the invention, as illustrated in the accompanying drawing, wherein.

Figure 1:
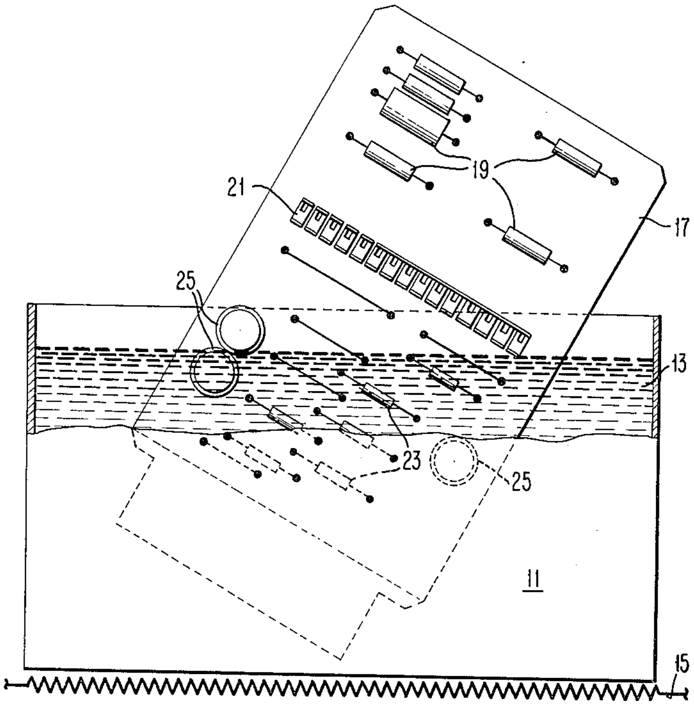
FIG. 1 is a cross-sectional view through a vessel containing a low-melting alloy of bismuth, lead, tin and cadmium showing a printed circuit card being dipped into the alloy to dissolve the solder joints preparatory to salvaging the components.
Figure 2:
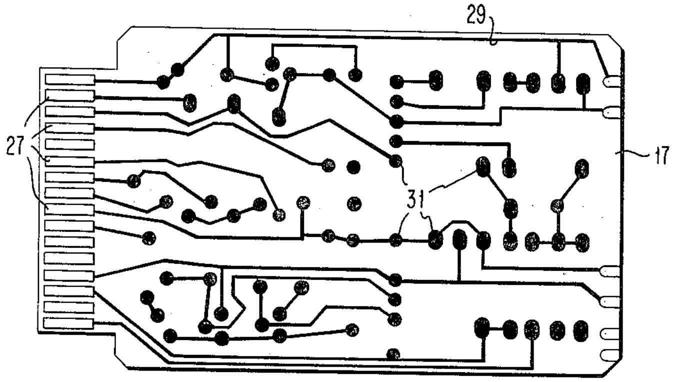
FIG. 2 is a rear plan view of the printed circuit card illustrated in FIG. 1.

In FIG. 1, a vessel 11 contains a bath 13 of a suitable bismuth-lead-tin-cadmium fusible alloy kept in a molten state by a burner or heater 15. In one example, the fusible alloy has a composition of 50% bismuth, 25% lead, 12.5% tin and 12.5% cadmium having a melting temperature of about 155° F. This particular composition normally goes directly from the solid to the liquid phase. A printed circuit card 17 is dipped partially into the fusible alloy bath 13 to dissolve the solder from the card so that the various components 19 on the card can be removed and salvaged. The components may include resistors and capacitors. Also illustrated are a metallic program cap 21, diodes 23, and transistors 25. The rear face of the card (FIG. 2) contains a plurality of gold-plated terminals 27 connecting with solder covered copper lines 29 leading to land areas 31. It will be understood that the component lead wires are inserted through holes in the board and clinched over onto the land areas. A suitable tin-lead solder is used, such as a 60% Sn–40%

Pb solder having a melting temperature in the range of 361° to 368° F. Further information on the printed circuit card can be obtained from Patent No. 3,008,113 to A. H. Johnson granted November 7, 1961. If desired, the lines 29 may be covered by a protective epoxy resin as described in the article, "Solder Mask Process," by L. B. Allen, C. W. Donald and E. R. York in the July 1961 issue of the IBM Technical Disclosure Bulletin, which is available at selected libraries throughout the world. In this arrangement only the land areas are covered with solder.

In the use of the method for salvaging components presently being described, the fusible alloy is conveniently heated to about 200° F. Although the melting temperature of the alloy given is about 155° F., the melting temperature of the alloy tends to rise as it becomes contaminated with tin and lead. A 200° F. temperature is high enough to allow for some contamination but is not high enough to damage the great majority of transistors. Thus in the practice of the present method, the printed circuit card is dipped into the bath 13 of fusible alloy for a fairly short time in the order of a few seconds depending on the mass of solder to be removed. Upon being retracted from the bath, the component leads can be easily unbent and the components pulled off of the card. In the case that the printed circuit card is made of cellulose paper impregnated with epoxy resin, it has been found that the surface of the card is blackened by the heat, but this can be scrapped off and the card reused if need be. The copper lines and gold terminal areas are not harmed by this short exposure to heat.

Other compositions of the bismuth-lead-tin-cadmium low-melting alloy can be utilized in the practice of this salvaging method. It is only necessary that the melting temperature be somewhat below 200° F. to allow for some contamination before reaching a temperature that harms the most temperature sensitive component, normally the transistors. Thus a eutectic composition of 50% Bi, 26.7% Pb, 13.30% Sn and 10.00% Cd which has a melting temperature of 158° F. is suitable. The following non-eutectic compositions also can be used, though they are less desirable because among other reasons they become contaminated more quickly:

| Composition | | | | Yield Temp., ° F. | Melting Temp., ° F. |
|---|---|---|---|---|---|
| Bi | Pb | Sn | Cd | | |
| 50.50 | 27.8 | 12.50 | 9.30 | 159 | 158 to 163 |
| 50.00 | 34.5 | 9.30 | 6.20 | 162 | 158 to 174 |
| 50.72 | 30.91 | 14.97 | 3.40 | 163 | 158 to 183 |

For the last two compositions given it is desirable to heat the liquid bath to about 200° F., but for the first composition in this table and the two compositions previously given in which the melting temperature is 163° F. or less, heating the bath to a temperature in the range of about 180° F. to 200° F. is sufficient.

Figure 3:
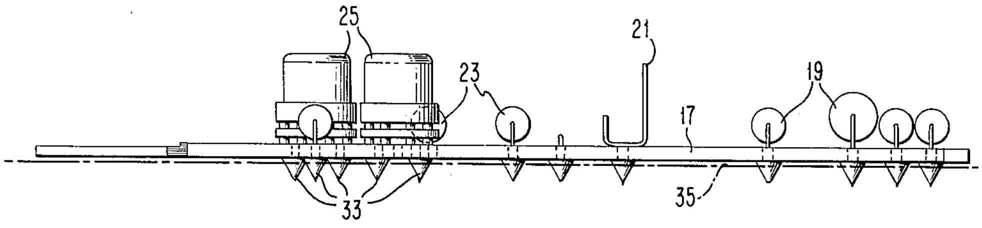
FIG. 3 is an edge view of the card shown in FIG. 2.
Figure 4:
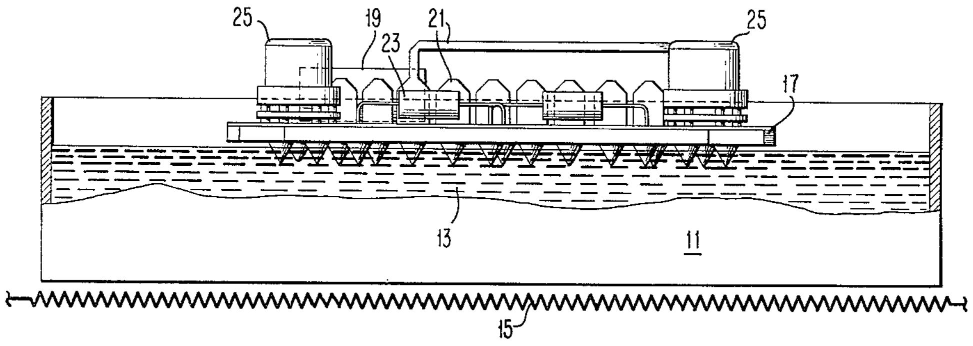
FIG. 4 is a cross-sectional view through a bath of the low melting alloy showing skimming a printed circuit card above the surface of the alloy to remove excess solder.

Another use of the low-melting alloys to dissolve solder is illustrated in FIGS. 3 and 4. Upon emerging from a dip soldering or wave soldering apparatus, there is a tendency for large masses or globs of solder 33 to form at the land areas or where the lines are close together. There may be formation of "icicles." These solder globs 33 tend to make for poor appearance, may form bridges over to an adjacent land area or line, increase the mass and size of the card, and make hand touch up operations more difficult. Consequently it is desirable to shave off the excess solder projecting beyond an arbitrarily chosen plane 35 relative to the rear face of the card 17. The plane 35 should be sufficiently distant from the card to allow for good electrical connection and to cover the clinched over leads of the various components and the connections for the program cap 21.

As shown in FIG. 4, the card 17 is skimmed above the surface of the bath 13 of low-melting alloy. The height of the surface of the printed circuit card above the bath corresponds to the desired location of the plane 35. The portion of the solder globs or icicles 33 which dip into the low-melting alloy is dissolved or absorbed, while the portion above the surface of the liquid is unaffected. The rate of removal of the excess solder projecting below the chosen plane 35 is fairly rapid, depending on the mass of solder to be removed, and has been determined to be. .001″/sec. as an approximation. The printed circuit card may be placed on a belt or worm and moved across the top of the bath 13 following dip or wave soldering in an automated line, and the time required to traverse the vessel 11 is sufficient to remove the excess solder.

The composition of the low-melting alloy for this use is preferaby the same as given above for the salvaging of components by dipping all or part of the printed circuit card into the molten liquid. A composition having a relatively low melting temperature, below 200° F., is desirable because it requires less heat to keep it in liquid state and because there is greater latitude to being contaminated before the dissolved tin and lead in the alloy causes its melting temperature to rise above about 200° F. It is further desirable to have as wide a difference as is possible between the melting point of the solder and the temperature of the low-melting alloy bath. This minimizes the heat imparted to the solder above the surface of the bath, both to reduce heat losses and to lessen the chance that the solder just within the plane 35 and above the surface of the bath will be liquefied. However, good results have been achieved when the alloy has been heated to about 250° F. Under good conditions the plane produced when the excess solder is removed is well defined, and the remaining solder shows no detrimental change in its characteristics. A bath composed of 50% Bi, 25% Pb, 12.5% Sn and 12.5% Cd and having a melting temperature of 155° F. produces good results and is available commercially. Another composition of 50.00% Bi, 26.70% Pb, 13.30% Sn and 10.00% having a melting temperature of 158° F. gives equally good results. The three noneutectic compositions mentioned previously can be used but are again less desirable for similar reasons.

In choosing the composition of the fusible alloy, it is noted certain of these quaternaary alloys expand or shrink during solidification. In general, the alloys containing more than 55% bismuth expand during solidification, while those containing 48% to 55% bismuth exhibit little change in volume. Bismuth alloys that contain 33% to 66% lead, even when moderate amounts of other metals are present, usually exhibit growth after solidification and during aging. In order to avoid breaking the vessel 11 containing the low-melting alloy bath, an alloy which expands appreciably during solidification should not be used. Thus compositions having between 48% and 55% of bismuth are preferred, and those having more than 33% lead should be avoided. Although a 60% Sn–40% Pb solder has been discussed, tin-lead solders having a range of about 5–95% of tin generally are dissolved in the low-melting alloys described herein. Small amounts of impurities do not significantly affect the dissolving or absorbing action in the low-melting alloy.

The new use of quaternary low-melting alloys containing bismuth, lead, tin and cadmium to selectively remove excess tin-lead solder has the particular advantages of being simple and, due to the low temperature of the bath, causes little thermal shock or damage to electrical components.

While the invention has been particularly shown and described with reference to preferred embodiments thereof, it will be understood by those skilled in the art that various changes in form and details may be made therein without departing from the spirit and scope of the invention.

What is claimed is:

1. The method of removing excess tin-lead solder projecting beyond a desired plane spaced from one surface of a printed circuit board on which the solder is deposited and from which excess solder is to be removed, the desired plane being located at the same side of the circuit board as said one surface, comprising the steps of skimming said one surface of the circuit board above the surface of a liquid bath of low-melting quaternary alloy of bismuth, lead, tin and cadmium heated to a temperature of about 200° F., the low-melting alloy comprising between 48% and 55% of bismuth, less than 33% lead, and having a melting temperature below about 185° F., the distance of said one surface of the board above the surface of the liquid bath being such that only the excess solder projecting beyond the desired plane dips into the liquid bath and is dissolved therein while that portion of the solder between the desired plane and said one surface of the board is unaffected, and removing the circuit board from the proximity of the bath.

2. The method of removing excess tin-lead solder projecting beyond a desired plane spaced from one surface of a printed circuit board on which the solder is deposited and from which excess solder is to be removed, the desired plane being located at the same side of the circuit board as said one surface, and the circuit board having attached thereto components which are harmed by temperatures greater than about 200° F., comprising the steps of skimming said one surface of the circuit board above the surface of a liquid bath of low-melting alloy heated to a temperature about 200° F. and comprising approximately 50% bismuth, 25–31% lead, 9–15% tin, and 13–3% cadmium, the distance of said one surface of the board above the surface of the liquid bath being such that only the excess solder projecting beyond the desired plane dips into the liquid bath and is dissolved therein while that portion of the solder between the desired plane and said one surface of the board is unaffected, and removing the circuit board from the proximity of the bath.

3. The method of removing excess tin-lead solder projecting beyond a desired plane spaced from one surface of a printed circuit board on which the solder is deposited and from which excess solder is to be removed, the desired plane being located at the same side of the circuit board as said one surface, comprising the steps of skimming said one surface of the circuit board above the surface of a liquid bath of low-melting alloy heated to a temperature in the range of 180° to 200° F. and comprising approximately 50% bismuth, 25–28% lead, 12–13% tin, and 13–9% cadmium, the distance of said one surface of the board above the surface of the liquid bath being such that only the excess solder projecting beyond the desired plane dips into the liquid bath and is dissolved therein while that portion of the solder between the desired plane and said one surface of the board is unaffected, and removing the circuit board from the proximity of the bath.

4. The method of removing excess 60% tin–40% lead solder which projects beyond a desired plane spaced from one surface a printed circuit board on which the solder is deposited and from which excess older is to be removed, the desired plane being located at the same side of the circuit board as said one surface, and the circuit board having attached thereto components which are harmed by temperatures greater than about 200° F., comprising the steps of skimming said one surface of the circuit board above the surface of a liquid bath of low-melting alloy heated to a temperature in the range of 180° to 200° F. and comprising approximately 50% bismuth, 25% lead, 12.5% tin and 12.5% cadmium, the distance of said one surface of the board above the surface of the liquid bath being such that only the excess solder projecting beyond the desired plane dips into the liquid bath and is dissolved therein while that portion of the solder between the desired plane and said one surface of the board is unaffected, and removing the circuit board from the proximity of the bath.

References Cited by the Examiner

UNITED STATES PATENTS

| | | | |
|---|---|---|---|
| 1,881,887 | 10/32 | Normann | 134—5 |
| 2,094,632 | 10/37 | Betterton | 75—63 |
| 2,382,723 | 8/45 | Kirsebom | 75—63 |
| 2,683,085 | 7/54 | Tohberg | 75—63 |

OTHER REFERENCES

Metals Handbook, 1948 Ed., pp. 744–745, American Society For Metals, Cleveland, Ohio (copy in Scientific Library).

BENJAMIN HENKIN, *Primary Examiner.*

DAVID L. RECK, *Examiner.*